United States Patent
Christensen

(10) Patent No.: US 6,373,698 B1
(45) Date of Patent: Apr. 16, 2002

(54) APPARATUS FOR COOLING A COMPUTER SYSTEM

(75) Inventor: Steven Michael Christensen, Leander, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/848,177

(22) Filed: May 3, 2001

(51) Int. Cl.$^7$ ................................................. H05K 7/20
(52) U.S. Cl. ...................... 361/695; 361/690; 361/687; 174/16.1; 454/184; 312/223.2; 292/85
(58) Field of Search ................................ 361/683–686, 361/687–690, 694, 695, 726, 727, 747; 174/15.1, 16.1; 439/79, 166; 454/184; 312/223.2; 292/85, DIG. 49, DIG. 30, DIG. 31

(56) References Cited

U.S. PATENT DOCUMENTS

| | | | | |
|---|---|---|---|---|
| 4,744,055 A | * | 5/1988 | Milani | 361/687 |
| 4,982,303 A | * | 1/1991 | Krenz | 360/137 |
| 5,045,960 A | * | 9/1991 | Eding | 360/97.01 |
| 5,208,730 A | * | 5/1993 | Tracy | 361/687 |
| 5,359,492 A | * | 10/1994 | Porter | 361/683 |
| 5,465,191 A | * | 11/1995 | Nomura et al. | 361/681 |
| 5,562,410 A | * | 10/1996 | Sachs et al. | 415/213.1 |
| 5,997,266 A | * | 12/1999 | Lecinski et al. | 417/423.14 |
| 6,031,719 A | * | 2/2000 | Schmitt et al. | 361/695 |
| 6,040,981 A | | 3/2000 | Schmitt et al. | 361/695 |
| 6,139,213 A | * | 10/2000 | Osborne et al. | 403/322.4 |
| 6,236,564 B1 | * | 5/2001 | Fan | 361/695 |
| 6,244,953 B1 | * | 6/2001 | Dugan et al. | 454/184 |
| 6,285,548 B1 | * | 9/2001 | Hamlet et al. | 361/695 |

* cited by examiner

Primary Examiner—Leo P. Picard
Assistant Examiner—Boris L. Chervinsky
(74) Attorney, Agent, or Firm—Anthony England; Casimer K. Salys

(57) ABSTRACT

A cooling apparatus for a computer system includes a fan operable to provide convective cooling to contents of a computer system housing. The fan is at least partly surrounded by a fan housing. A handle is hinged to a top side of the fan housing operable to engage the computer system housing for levering the fan housing in and out of the computer system housing. The handle is foldable into a position lying along the top of the fan housing. A latch includes a movable latch portion which is operable to fasten the handle into the folded position. With the handle in the folded position, a distinctive marking on the latch portion is visible from above the top side of the fan housing so that it is apparent how to release the handle and the fan.

21 Claims, 5 Drawing Sheets

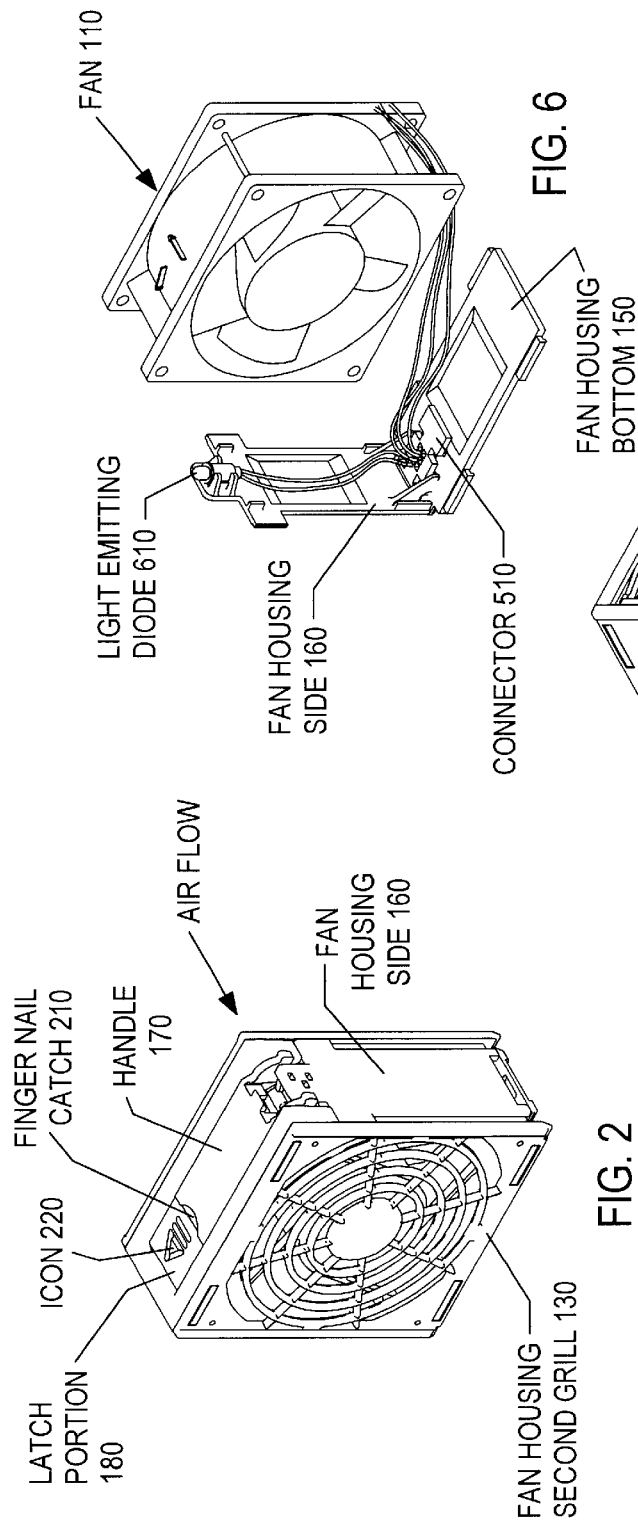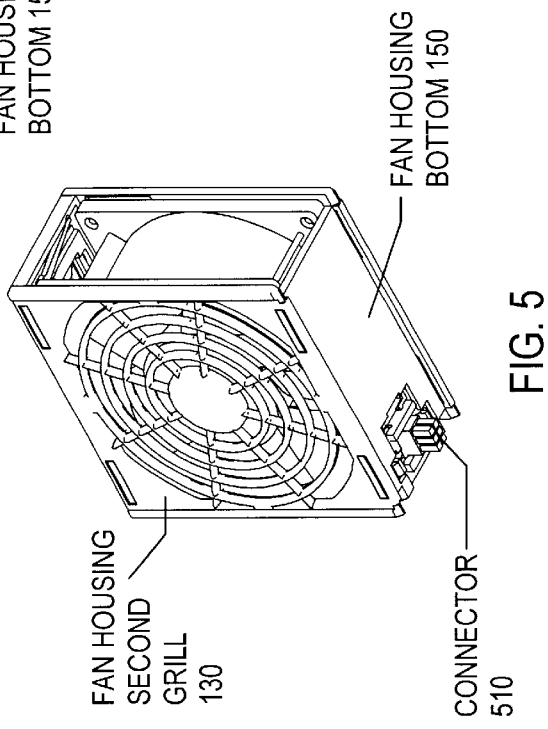

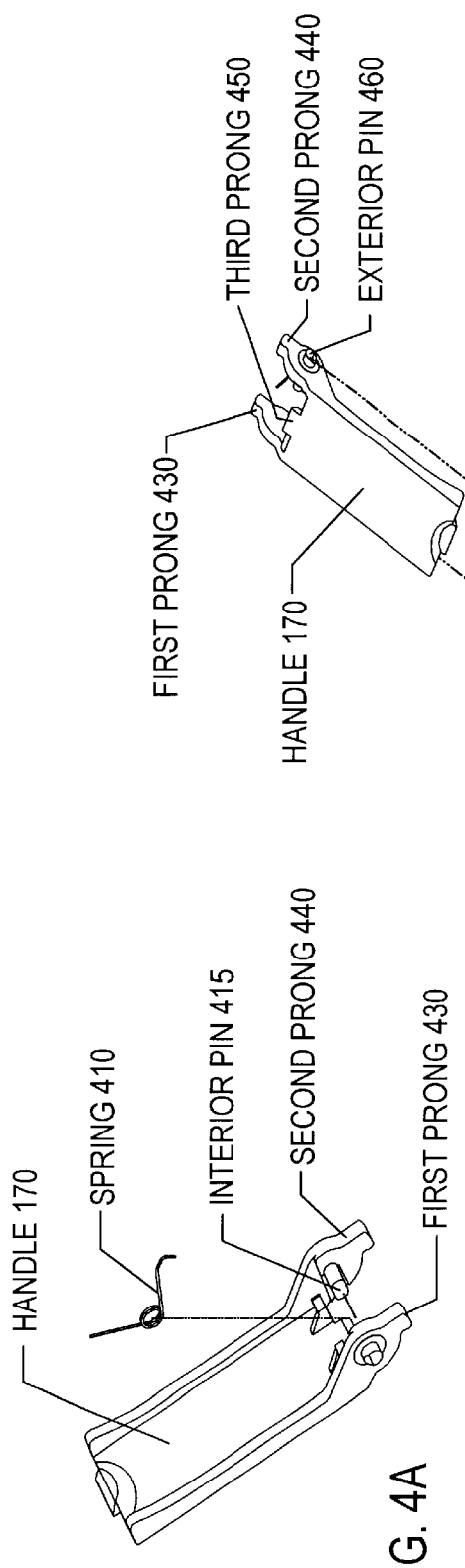
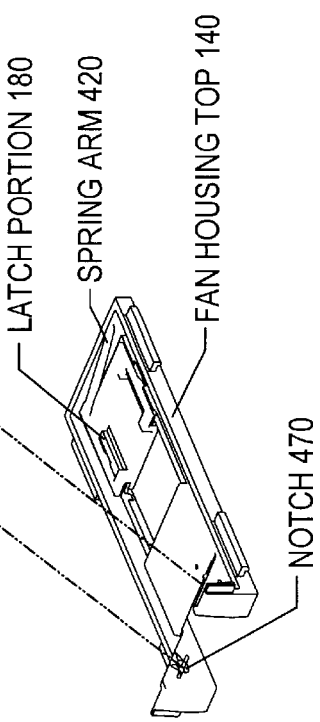
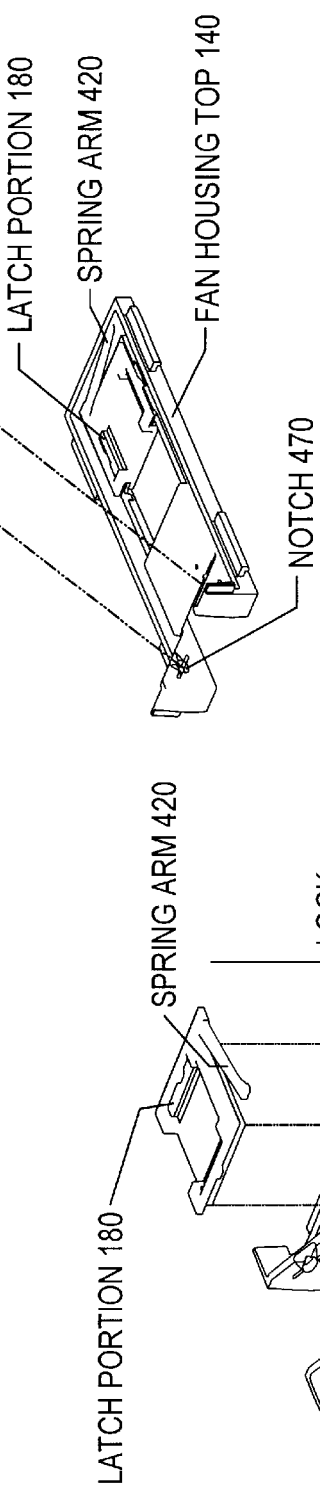

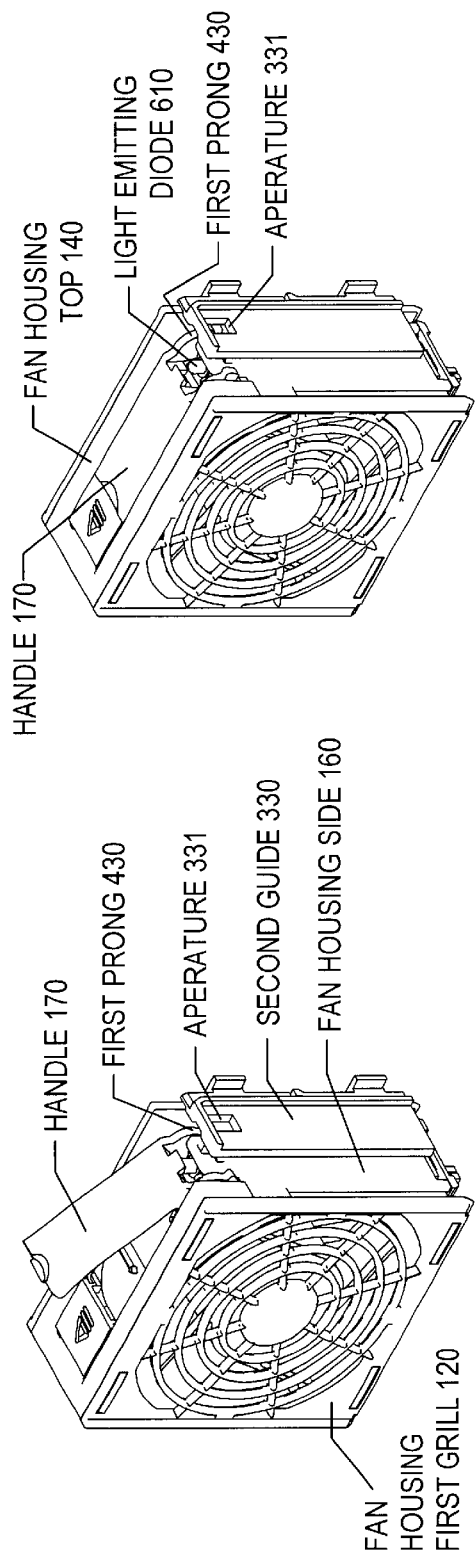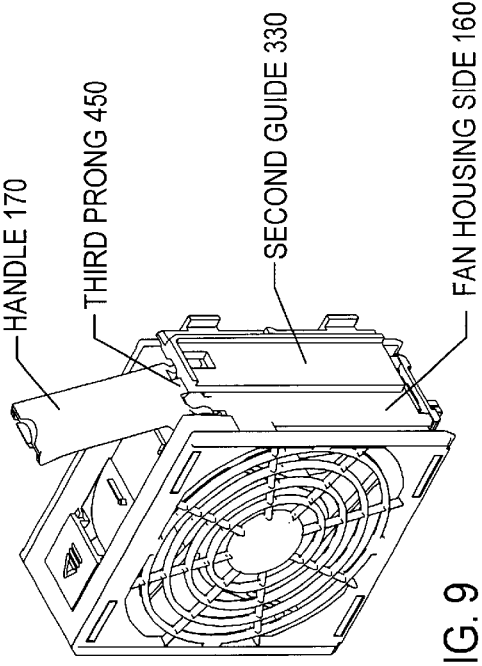
FIG. 7
FIG. 8
FIG. 9

APPARATUS FOR COOLING A COMPUTER SYSTEM

BACKGROUND OF THE INVENTION

1. Field of the Invention

This invention relates generally to cooling of computer systems, and more particularly to a cooling apparatus that can easily be inserted and removed from a computer system housing.

2. Related Art

In modern computer systems, there are trends toward reduced computer system housing size, increased processor capability, and even multiple processors in relatively inexpensive computer systems. This particular set of circumstances contribute to increased heating within computer system housings. Increased heating makes cooling of computer systems more important, while reduced size makes such cooling all the more difficult to achieve. Furthermore, at the same time computer systems are getting smaller and more powerful, they are also getting less expensive.

Therefore a need exists for an improved computer system cooling apparatus which is compact, inexpensive and easy to service.

SUMMARY

The foregoing need is address in a cooling apparatus for a computer system which includes a fan operable to provide convective cooling to contents of a computer system housing. The fan is at least partly surrounded by a fan housing. A handle is hinged to a top side of the fan housing, and is operable to engage the computer system housing for levering the fan housing in and out of the computer system housing. The handle is foldable into a position lying along the top of the fan housing. A latch for the apparatus includes a movable latch portion for holding the handle in the folded position. A distinctive marking on the latch is visible from above the top side of the fan housing so that it is apparent how to release the handle and the fan. The marking is particularly visible with the handle in the folded position.

In a further aspect, the computer system housing has first and second guides for receiving the fan housing. With the handle in the folded position the handle engages one of the guides at a point of engagement to fasten the fan housing into the computer system housing. The engagement point is visible from above the fan housing, so that it is further apparent how to release the handle and the fan. In another aspect, the apparatus includes a light emitting diode adjacent to the engagement point, also visible from above the fan housing.

The fan housing has an attached electrical connector for connecting the fan to a power supply and to control signals for the computer system. A second, mating electrical connector is attached to the computer system housing. The computer system housing has guides which are keyed to the fan housing so that the fan housing fits between the guides only if the fan housing has a certain alignment with respect to the guides. With the fan housing inserted between the guides in the certain alignment, the two electrical connectors mate with one another.

Other objects and advantages of the invention will become apparent upon reading the following detailed description and upon reference to the accompanying drawings.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment read in conjunction with the accompanying drawings.

FIG. 2 shows the assembled apparatus of FIG. 1.

FIG. 4A shows details of the handle of the previous figures.

FIG. 4B provides a view of the bottom side of the fan housing top of the previous figures.

FIG. 4C illustrates assembly of the handle and fan housing top of FIGS 4A and 4B.

FIG. 5 provides a view of the assembled fan and fan housing in which the fan housing bottom is visible.

FIG. 6 shows a partial assembly which illustrates details of the fan housing side assembled to fan housing bottom with a connector fixed to the fan housing bottom.

FIG. 7 shows details of how the handle engages one of the guides to cam the fan and fan housing into the computer system housing.

FIG. 8 shows the fan and fan housing inserted in the computer system housing.

FIG. 9 shows details of how the handle engages one of the guides to cam the fan and fan housing out of the computer system housing.

DETAILED DESCRIPTION OF THE PREFERRED EMBODIMENT

Figure 1:
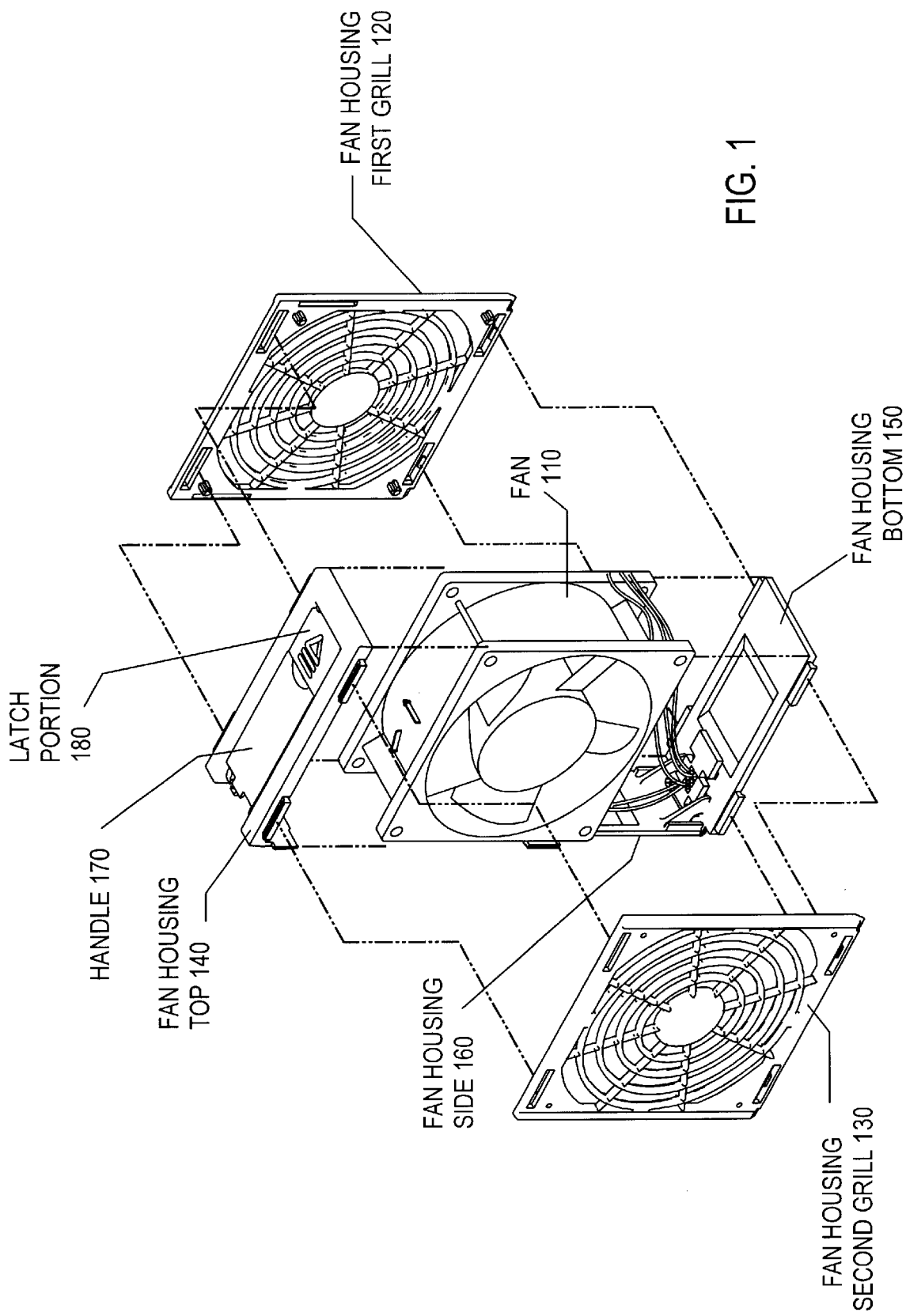
FIG. 1 shows a fan, fan housing, handle and latch portion in an exploded view, according to an embodiment of the invention.

In the following detailed description of the preferred embodiments, reference is made to the accompanying drawings illustrating embodiments in which the invention may be practiced. It should be understood that other embodiments may be utilized and changes may be made without departing from the scope of the present invention.

While the invention is susceptible to various modifications and alternative forms, specific embodiments thereof are shown by way of example in the drawings and will be described herein in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Referring now to FIG. 1, a fan 110, fan housing 120 through 160, handle 170 and latch portion 180 are shown in an exploded view, according to an embodiment of the invention. The fan housing includes a first grill 120 that mounts on one major side of the fan 110, and a second grill 130 that mounts on the other major side. In operation, the fan takes in air on one of the sides, through one of the grills 120 or 130, and discharges the air on the opposing side, through the other grill.

The fan housing also includes a top 140 which mounts above the fan 110, a bottom 150 which mounts below the fan 110, and a side 160 which mounts at a minor side of the fan 110. The top 140, bottom 150 and side 160 all mount by attaching to the grills 120 and 130. Note that in this embodiment one of the fan minor sides has no corresponding fan housing side.

As shown in FIG. 1, the top 140 defines an opening into which the latch portion 180 is inserted. Thus the latch portion 180 as shown lies flat along the top of the fan 110 and is recessed in the top 140 opening so that the latch portion 180 is flush in the fan housing top 140. Likewise, the handle 170 as shown is in a folded position lying flat along the top of the fan 110 and is recessed flush in the opening of the fan housing top 140.

The handle latches as follows. The handle 170 is hinged to the fan housing top 140. The latch portion 180 overlaps an edge of the handle 170. The latch portion 180 can slide a short distance in the opening of the top 140 in the direction of the arrow head shown on the top of the latch portion 180. The latch portion 180 is referred to as a "portion" because latching of the handle 170 in the folded position is accomplished not only by the overlapping of the latch portion 180, but also by resistance to sliding the latch portion 180. The resistance is provided by a spring arm attached to the latch portion 180 described further hereinbelow, in connection with FIGS 4B and 4C.

Referring now to FIG. 2, the assembled apparatus of FIG. 1 is shown. As may be seen in this view, the handle 170 and latch portion 180 form a fingernail catch 210 where a user can catch his or her fingernail in order to slide the latch portion 180 away from the handle 170 to release the handle 170. In an alternative embodiment (not shown), the latch portion 180 forms the fingernail catch 210. The latch portion 180 has an icon 220 for directing the user's attention to the latch portion 180 so that it is clearly apparent to the user how to release the handle 170. Releasing the handle 170 is necessary in order to release the fan 110 and fan housing from a computer system housing (not shown in FIG. 2). In this embodiment the icon 220 includes an arrow head pointed in the direction in which the user's force is to be applied against the latch portion 180 in order to release the handle 170.

The icon 220 is brightly colored, whereas fan housing top 140 is not. This color contrast between the icon 220 and the fan housing top 140 also serves to direct the user's attention to the latch. In an alternative embodiment, some other portion of the top surface of the latch portion 180 is brightly colored instead of, or in addition to, the icon 220.

Figure 3:
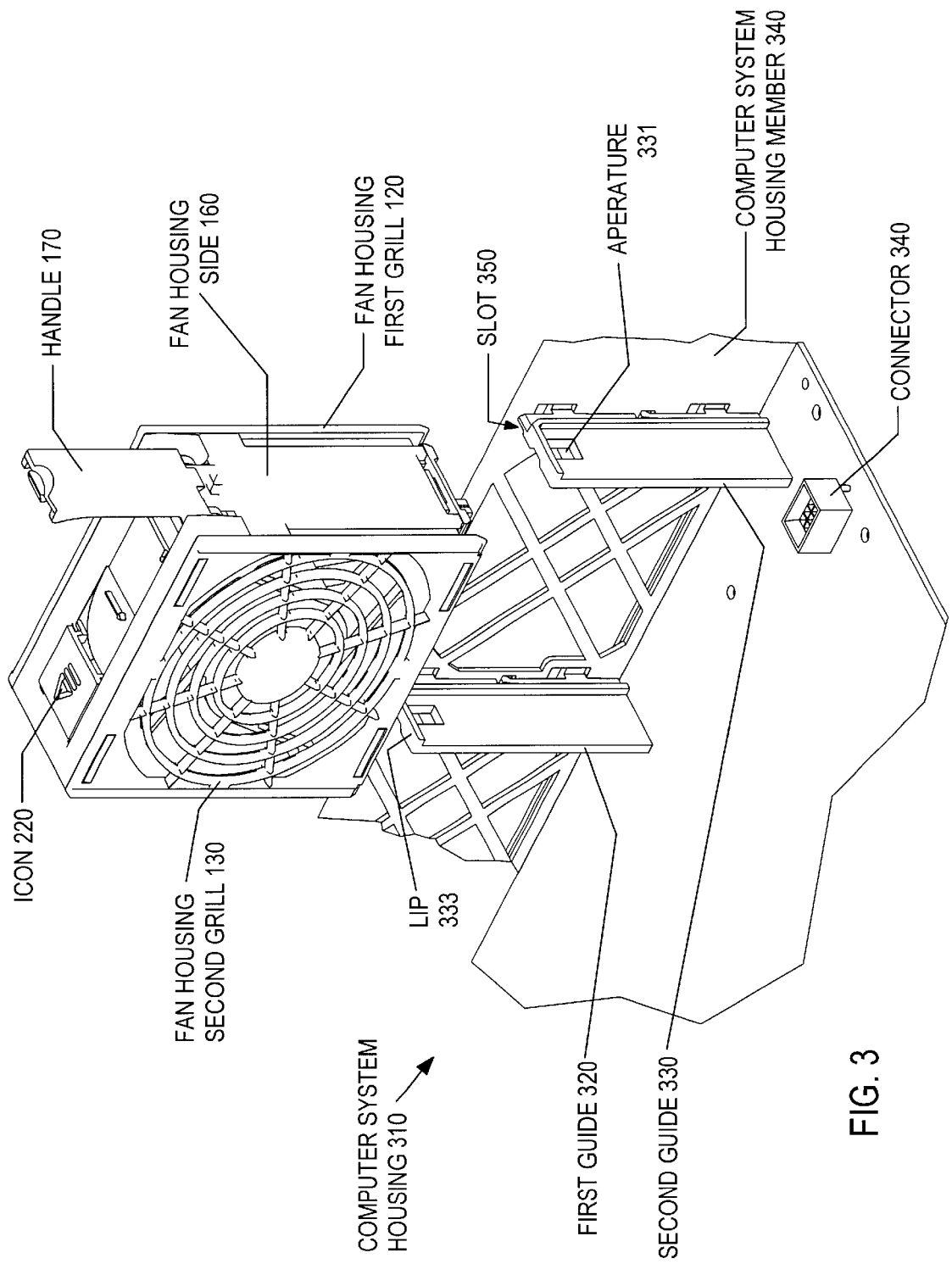
FIG. 3 illustrates a computer system housing, including first and second guides for receiving the fan housing, according to an embodiment.

Referring now to FIG. 3, a computer system housing 310 is shown, including a first guide 320 and second guide 330, which are mounted in a position on the housing 310 for receiving the fan housing. Each of the guides 320 and 330 is attached to a computer system housing member 340 and forms a respective slot 350 with the member 340 for receiving an edge of one of the fan housing grills, in this case, as shown, first grill 120. A connector 340 is mounted on the computer system housing 310 for mating up with a connector (not shown) for the fan 110.

Each of the guides 320 and 330 forms a respective aperture 331 and each guide has a respective lip 333. The guides 320 and 330 are attached to computer system housing 310 with each lip 333 facing in the same direction, so that the fan 110 and fan housing can only be inserted in one possible orientation. That is, as was pointed out in connection with FIG. 1, one of the fan minor sides has no corresponding fan housing side. The lip 333 facing inward on the guide 320, i.e., toward the other guide 330, interferes with the insertion of the fan housing top 140, bottom 150 or side 160, unless the fan is inserted between the guides with the open side of the fan housing adjacent to the inward facing lip 333 of guide 320, that is, with the fan housing side 160 adjacent to the interior side of the guide 330 having the outward facing lip 333. In this way the guides and fan housing are effectively keyed to one another. With the fan 110 inserted into the computer system housing 310 between the guides 320 and 330, the color contrasting icon 220 is visible from above the fan housing top 140.

Referring now to FIG. 4A, details of the handle 170 are shown, as well as a spring 410 which mounts on the handle. The handle 170 has two interior pins, one of which, pin 415 is visible in this view. The spring 410 is mounted on one of the pins 415, and is operable to pop up the handle from the folded position responsive to the latch being released. The handle 170 also has first prong 430 and second prong 440, one of which is used for levering the fan into the computer system housing 310 (FIG. 3), as will be described further hereinbelow. (In an alternative embodiment both of the prongs 430 and 440 may be used for the levering.)

Referring now to FIG. 4B, the bottom side of fan housing top 140 is shown, along with latch portion 180 and spring arm 420. The spring arm 420 clips to the latch portion 180, and the two of them clip into the opening of the top 140.

Referring now to FIG. 4C, assembly of the handle 170, latch portion 180, spring arm 420 and fan housing top 140 are illustrated.

Assembly of the handle 170 to the top 140 is as follows. The top 140 forms two "C" shaped notches 470, one of which is visible in this view. The handle 170 has two exterior pins, one of which, pin 460 is visible in this view. The handle 170 is hinged to the fan housing top 140 by the pins 460 engaging respective notches 470 in the top 140, as indicated. Also visible in this view is third prong 450 of the handle 170, which is used for levering the fan out of the computer system housing 310 (FIG. 3), as will be described further hereinbelow.

Assembly and operation of the latch portion 180 and spring arm 420 are as follows. As previously stated, the spring arm 420 clips to the latch portion 180, and the two of them clip into the opening of the top 140. A user can slide the latch portion 180 and spring arm 420 slightly toward the proximate end of the top 140; however, when this is done the spring arm 420 contacts the lip at the end of the top 140, as shown. Therefore when the user releases the latch portion the spring arm 420 drives the latch portion 180 back away from the proximate end, i.e., toward the handle 170. With the handle 170 in the folded position (as in FIG. 1, for example) the spring arm 420 pushes the latch portion 180 to overlap the handle 170 and hold the handle 170 closed, i.e., in the folded position.

Referring now to FIG. 5, a view of the assembled fan 110 and fan housing are shown from which the fan housing bottom 150 is visible, illustrating the fan connector 510 mounted in the bottom 150. As previously stated, connector 510 mates with connector 340 (FIG. 3) when the fan is properly inserted between the guides 320 and 330 (FIG. 3).

Referring now to FIG. 6, a partial assembly is shown, with the fan housing side 160 assembled to fan housing bottom 150, and with the connector 510 inserted in an opening in the bottom 150. The connector is wired to the fan 110 and to a light emitting diode ("LED") 610.

Referring now to FIG. 7, details are shown for levering the fan 110 and fan housing into the computer system housing 310 (FIG. 3). With handle 170 flipped up, that is, not in the folded position, the first prong 430 of the handle 170 does not interfere with the insertion of the fan 110 into the computer system housing 310 between the guides (guide 330 is shown). Then, once fully inserted, the handle maybe moved downward toward the folded position, and the first prong 430 will then insert into aperture 331. As the handle is pressed downward at the end remote from the prong 430, the top of the prong 430 will engage the top of the aperture 331. Note that the length of the handle 170 from the pins 415 (FIG. 4A) to the end of the handle 170 remote from the pins 415 is substantially longer than the length of the handle 170 from the pins 415 to the end of the prong 430. Therefore, as the handle 170 is rotated about the axis of the pins 415 by pushing on the end remote from the axis, engagement of the prong 430 and the guide 330 provides a lever action with a mechanical advantage that forces the fan 110 and fan housing into a fully inserted position between the guides 320 and 330 (FIG. 3). This action of rotating the handle 170 about an axis by pushing or pulling on the end of the handle 170 most distant from the axis, engaging of a portion of the handle most near the axis, e.g., the prong 430, with a portion of the computer system housing 310, e.g., the guide 330, and thereby forcing the fan 110 and fan housing into a fully inserted position in the computer system housing 310, e.g., between the guides 320 and 330, is referred to herein as "levering the fan housing into the computer system housing."

Referring now to FIG. 8, the fan 110 and fan housing are shown in the fully inserted position with the handle 170 folded and latched. In this position, the first prong 430 remains inserted in the aperture 331, that is, the point of engagement between the handle 170 and the guide 330. With the fan 110 and fan housing between the guides 320 and 330 (FIG. 3), with the edges of the grills 120 and 130 (FIG. 3) in the slots 350 (FIG. 3), the prong 430 of the handle 170 inserted in the aperture 331 due to the handle 170 being in the folded position, and the handle 170 held in the folded position by the latch portion 180 overlapping the handle 170 and by the latch portion being held against and overlapping the handle 170 by the spring arm 420 (FIG. 4C), the fan 110 and fan housing are held fastened into place in the computer system housing 310 (FIG. 3).

The point of engagement is visible from above the fan housing top 140. This tends to make it apparent to a user how the fan is fastened into the computer system housing. Also note that in this position the LED 610 is adjacent to the point of engagement and is visible from above the fan housing top 140. This LED 610 is operable to light up responsive to a malfunction detected by the computer system (not shown), so that the attention of a user or service technician is drawn to the fan 110 and fan housing top 140, and more specifically to the point of engagement of the handle 170 and the guide 330 which fastens the fan 110 into the computer system housing 310. Furthermore, since the latch portion 180 has the distinctive marking, i.e., contrasting coloring and icon 220 (FIG. 2), which are also visible from above the fan housing top 140, the user's or technician's attention is naturally directed to the way to release the fan 110 and fan housing from the computer system housing 310.

Referring now to FIG. 9, details are shown for levering the fan 110 and fan housing out of the computer system housing 310 (FIG. 3). With the fan in the fully inserted position between the guides 320 and 330 (FIG. 3) (guide 330 is shown in FIG. 9), raising the handle 170 causes the third prong 450 to engage the top of guide 330. As the handle is pulled up at the end remote from the prong 450, this will rotate the handle about the axis of the pins 415 (FIG. 4A) and force the fan 110 and fan housing out of the computer system housing 310 from between the guides 320 and 330.

The action of rotating the handle 170 about an axis by pushing or pulling on the end of the handle 170 most distant from the axis, engaging of a portion of the handle at the end most near the axis, e.g., the prong 450, with a portion of the computer system housing 310, e.g., the guide 330, and thereby forcing the fan 110 and fan housing out of a fully inserted position in the computer system housing 310, e.g., out from between the guides 320 and 330, is referred to herein as "levering the fan housing out of the computer system housing."

It should be understood from the foregoing, that it is a particular advantage of the invention that it is very intuitive how to insert the fan into and remove the fan out of the computer system housing. The fan can only be inserted in one way, which automatically aligns the connectors to mate. Furthermore, the inserting, mating and removing is made easier by the leverage provided by the handle engaging one of the guides. Also, fan housing parts are reduced to merely the top, bottom, side and grills, and their few subparts.

The description of the present embodiment has been presented for purposes of illustration, but is not intended to be exhaustive or to limit the invention to the form disclosed. Many modifications and variations will be apparent to those of ordinary skill in the art. For example, it should be understood that while the apparatus has been described as including numerous features such as the latch with distinctive marking to draw attention to its functioning, the visible engagement of the handle with one of the guides, the prominent LED adjacent to the point of engagement, the keying of the fan housing and the guides, etc. it would be within the spirit and scope of the invention to encompass an embodiment wherein one or more of these features was omitted.

To reiterate, the embodiments were chosen and described in order to best explain the principles of the invention, the practical application, and to enable others of ordinary skill in the art to understand the invention. Various other embodiments having various modifications may be suited to a particular use contemplated, but may be within the scope of the present invention.

What is claimed is:

1. A cooling apparatus for a computer system, the apparatus comprising:
   a fan operable to provide cooling to contents of a computer system housing;
   a fan housing;
   a handle hinged to a top side of the fan housing operable to engage the computer system housing for levering the fan housing in and out of the computer system housing, the handle being foldable into a folded position wherein the handle lies along the top of the fan housing; and
   a latch, including a moveable latch portion operable to fasten the handle into the folded position, wherein the latch portion includes a distinctive marking for directing attention to the latch, and wherein the latch portion marking is visible from above the top side of the fan housing.

2. The apparatus of claim 1, wherein the latch and the handle form a fingernail catch.

3. The apparatus of claim 1, wherein the latch portion forms a fingernail catch.

4. The apparatus of claim 1, wherein the distinctive marking includes an icon.

5. The apparatus of claim 1, wherein the distinctive marking includes a coloring.

6. The apparatus of claim 2, wherein the latch comprises a spring operable to push the latch portion to overlap the handle and hold the handle in the folded position.

7. The apparatus of claim 1, wherein the computer system housing has first and second guides for receiving the fan housing, wherein with the handle in the folded position the handle engages one of the guides at a point of engagement to fasten the fan housing into the computer system housing, and wherein the engagement point is visible from above the fan housing.

8. The apparatus of claim 7 comprising:
a light emitting diode adjacent to the point of engagement and visible from above the fan housing.

9. The apparatus of claim 1, wherein the computer system housing has first and second guides for receiving the fan housing, the apparatus comprising:
a first electrical connector attached to the fan housing; and
a second electrical connector attached to the computer system housing, wherein the guides and the fan housing are keyed so that the fan housing fits between the guides only if the fan housing has a certain alignment with respect to the guides, and wherein with the fan housing inserted between the guides in the certain alignment, the first and second electrical connectors mate with one another.

10. A cooling apparatus for a computer system, the apparatus comprising:
a fan operable to provide cooling to contents of a computer system housing;
a fan housing;
a handle hinged to a top side of the fan housing operable to engage the computer system housing for levering the fan housing in and out of the computer system housing, the handle being foldable into a folded position wherein the handle lies along the top of the fan housing; and
a latch, including a latch portion operable to fasten the handle into the folded position, wherein the computer system housing has first and second guides for receiving the fan housing, and with the handle in the folded position the handle engages one of the guides at a point of engagement to fasten the fan housing into the computer system housing.

11. The apparatus of claim 10, wherein the engagement is visible from above the fan housing.

12. The apparatus of claim 10 wherein the latch portion includes a distinctive marking for directing a user's attention to the latch, and wherein with the handle in the folded position the latch portion marking is visible from above the top side of the fan housing.

13. The apparatus of claim 12 comprising:
a light emitting diode adjacent to the engagement and visible from above the fan housing.

14. A cooling apparatus for a computer system, the apparatus comprising:
a fan operable to provide cooling to contents of a computer system housing;
a fan housing, wherein the computer system housing has first and second guides for receiving the fan housing;
a handle hinged to a top side of the fan housing operable to engage the computer system housing for levering the fan housing in and out of the computer system housing, the handle being foldable into a folded position wherein the handle lies along the top of the fan housing;
a latch operable to fasten the handle into the folded position;
a first electrical connector attached to the fan housing; and
a second electrical connector attached to the computer system housing, wherein the guides and the fan housing are keyed so that the fan housing fits between the guides only if the fan housing has a certain alignment with respect to the guides, and wherein with the fan housing inserted between the guides in the certain alignment, the first and second electrical connectors mate with one another.

15. The apparatus of claim 14 wherein the latch portion includes a distinctive marking for directing attention to the latch, and wherein with the handle in the folded position the latch portion marking is visible from above the top side of the fan housing.

16. The apparatus of claim 14, wherein the engagement is visible from above the fan housing.

17. The apparatus of claim 16 comprising a light emitting diode adjacent to the engagement area and visible from above the fan housing.

18. A cooling apparatus for a computer system, the apparatus comprising:
a fan operable to provide cooling to contents of a computer system housing;
a fan housing, wherein the computer system housing has first and second guides for receiving the fan housing;
a handle hinged to a top side of the fan housing operable to engage the computer system housing for levering the fan housing in and out of the computer system housing, the handle being foldable into a folded position wherein the handle lies flat along the top of the fan housing, wherein with the handle in the folded position, the handle engages one of the guides at a point of engagement to fasten the fan housing into the computer system housing;
a latch, including a latch portion operable to fasten the handle into the folded position; and
a second electrical connector attached to the computer system housing, wherein the guides and the fan housing are keyed so that the fan housing fits between the guides only if the fan housing has a certain alignment with respect to the guides, and wherein with the fan housing inserted between the guides in the certain alignment, the first and second electrical connectors mate with one another.

19. The apparatus of claim 18, wherein the engagement is visible from above the fan housing.

20. The apparatus of claim 18 comprising:
a light emitting diode adjacent to the engagement point and visible from above the fan housing.

21. The apparatus of claim 18 wherein the latch portion includes a distinctive marking for directing a user's attention to the latch, and wherein with the handle in the folded position the latch portion marking is visible from above the top side of the fan housing.

* * * * *